United States Patent
Zafiropoulo et al.

(10) Patent No.: US 8,067,305 B2
(45) Date of Patent: Nov. 29, 2011

(54) ELECTRICALLY CONDUCTIVE STRUCTURE ON A SEMICONDUCTOR SUBSTRATE FORMED FROM PRINTING

(75) Inventors: Arthur W. Zafiropoulo, Atherton, CA (US); Andrew M. Hawryluk, Los Altos Hills, CA (US)

(73) Assignee: Ultratech, Inc., San Jose, CA (US)

( * ) Notice: Subject to any disclaimer, the term of this patent is extended or adjusted under 35 U.S.C. 154(b) by 255 days.

(21) Appl. No.: 12/231,457

(22) Filed: Sep. 3, 2008

(65) Prior Publication Data

US 2010/0055895 A1    Mar. 4, 2010

(51) Int. Cl.
*H01L 21/44*   (2006.01)

(52) U.S. Cl. ............................ 438/610; 257/E21.59

(58) Field of Classification Search .............. 438/613, 438/610; 257/E21.589, E21.59
See application file for complete search history.

(56) References Cited

U.S. PATENT DOCUMENTS

| | | | |
|---|---|---|---|
| 5,204,055 A | 4/1993 | Sachs et al. | |
| 5,510,066 A | 4/1996 | Fink et al. | |
| 5,807,437 A | 9/1998 | Sachs et al. | |
| 5,997,795 A | 12/1999 | Danforth et al. | |
| 6,146,567 A | 11/2000 | Sachs et al. | |
| 6,401,001 B1 | 6/2002 | Jang et al. | |
| 7,202,155 B2 * | 4/2007 | Fukuchi | 438/622 |
| 2005/0037614 A1 | 2/2005 | Fukuchi | |
| 2007/0175296 A1 | 8/2007 | Subramanian et al. | |

FOREIGN PATENT DOCUMENTS

WO    01/96048 A1    12/2001
WO    2008/073297 A2   6/2008

* cited by examiner

*Primary Examiner* — W. David Coleman
(74) *Attorney, Agent, or Firm* — Allston L. Jones; Peters Verny, LLP

(57) ABSTRACT

Provided are methods for forming an electrically conductive structure of a desired three-dimensional shape on a substantially planar surface of a substrate, e.g., a semiconductor wafer. Typically, the particulate matter is deposited in a layer-by-layer manner and adhered to selected regions on the substrate surface. The particulate matter may be deposited to produce a mold for forming the structure and/or to produce the structure itself. A three-dimensional printer with associated electronic data may be used without the need of a lithographic mask or reticle.

34 Claims, 4 Drawing Sheets

ELECTRICALLY CONDUCTIVE STRUCTURE ON A SEMICONDUCTOR SUBSTRATE FORMED FROM PRINTING

BACKGROUND

1. Field of the Invention

The invention relates generally to methods for forming conductive structures on substrates. In particular, the invention relates methods that involve conductive structures of fine resolution formed using non-subtractive, printing, particulate deposition and/or bonding techniques.

2. Description of Background Art

Lithographic techniques are commonly used in the semiconductor industry and the microelectromechanical systems (MEMS) industry for fabricating devices. For example, front end semiconductor fabrication processes may use photolithographic techniques designed to image substrates via a coat-expose-remove process to form a desired pattern, e.g., a microelectronic circuit, on the substrate surface. Such techniques typically involve a substractive deposition procedure in which the entire substrate surface is coated with a photoresist, the photoresist is exposed to an image, and the photoresist is developed in a manner that results in the selective removal of photoresist from the substrate surface. As a result, the photoresist forms a pattern that corresponds to the image. The remaining resist may serve as a mold in which material may be deposited.

Moore's Law describes a historical trend in the microelectronic and semiconductor industry, which holds that the number of transistors per unit area that can be included on a silicon-based integrated circuit doubles about every two years. Since this observation was described in a 1965 paper, the trend has continued for more than half a century. Persons of ordinary skill in the art recognize that almost every measure of the capabilities of digital electronic devices is linked to Moore's Law. Improvements in lithographic technology are seen as a driver for advancing Moore's law in the quest to produce smaller and smaller transistors, thereby resulting in improved device performance at a lower cost.

Recently, photolithographic technology has found greater utilization in back-end semiconductor fabrication processes, e.g., those involving semiconductor packaging. Previously, advanced semiconductor packaging has generally involved wire-bonding individual dies formed from semiconductor wafers. More recently, however, photolithographic techniques have been used to pattern wafer-level interconnects. Similarly, photolithographic techniques have been proposed for use with reconstituted substrates.

In particular, photolithographic technologies have been used in microelectronic packaging applications to define an electroplating mold in which metal is electroplated. Once the mold is removed, the electroplated metal may serve as conductive interconnects.

Typically, photolithographic techniques in the context microelectronic packaging applications involve several steps. First, a wafer containing microelectronic devices is spin coated with photoresist. Then the wafer is baked to drive out solvents in the resist, and exposed lithographically using a photolithography tool and a master pattern, e.g., a mask or reticle. Once exposed, the resist is developed and baked again to enhance its stability. The wafer's surface is then cleaned to remove any residual contaminants. Once the surface has been cleaned, metal is electroplated thereon. Finally, resist is stripped from the wafer, leaving the metal to serve as conductive interconnects.

In practice, the above-described example requires a track containing numerous expensive and complex tools in a manufacturing line. For example, the line requires a resist dispenser/spin coater to spread the photoresist uniformly on the wafer. After the wafer is coated, the wafer is transferred to a heating station followed by a lithography tool. Once exposed, the wafer is passed on to developer and post-exposure heating stations. Then, the wafer is passed on to a plasma ashing station for cleaning. After plating has occurred in an electroplating bath, the remaining resist is removed using a strip tool.

The above-described photolithography-based electroplating sequence is generally considered a complex process in the context of microelectronic packaging applications. Other microelectronic packaging applications of a similar level of complexity include, for example, those involving solder-bumping, redistribution layers, and reconstituted substrates with associated devices. In addition, numerous microelectronic packaging applications involve the use of a reticle for exposure during a lithography step. Depending upon the linewidths, pattern complexity and wafer volume, reticle costs per wafer can be significant.

As process simplification tends to reduce process cost and improve process reliability, there is an unmet need for improved technologies whose performance meets that of photolithographic technologies for microelectronic applications without the drawbacks associated with photolithography.

SUMMARY

In a first embodiment, a method is provided for forming an electrically conductive structure of a desired three-dimensional shape on a substantially planar surface of a semiconductor substrate. The method involves depositing and bonding particulate matter at selected locations on the substrate surface to produce a mold having a cavity therein defined by an interior surface that extends from a substantially planar base opening abutting the substrate surface. The cavity exhibits the desired three-dimensional shape. The mold cavity is filled with an electrically conductive material to form an electrically conductive structure. Without displacing the conductive structure from the substrate surface, the mold is removed from the substrate surface. As a result, the method may be used to a conductive structure that stands independently from the mold or some another type of freestanding structure of the desired three-dimensional shape.

In another embodiment, a similar method is provided, with that method involving a three-dimensional printer in combination with electronic data relating a mold having a cavity therein. The printer is constructed to operate without need for a lithographic mask or reticle and is used to produce the mold on the substrate. After the mold is filled with a conductive material to form a conductive structure of the desired three-dimensional shape, the mold is removed from the substrate surface without removing the conductive structure from substrate surface or altering the shape of the conductive structure. Optionally, the electronic data may be produced using computer-aided design software and the mold produced without using a subtractive step.

In still another embodiment, a method is provided for forming a package for a semiconductor microelectronic device. The method involves depositing and bonding particulate matter at selected locations on a surface of a substrate to produce a mold as generally described above and filling the mold with a conductive material to form a conductive structure of the desired three-dimensional shape. The conductive structure is rendered electrically connected with the semiconductor microelectronic device.

In yet another embodiment, a further similar method is provided, with conductive particulate matter deposited and bonded at selected locations on the substrate surface to produce the conductive structure of the desired dimensional shape. The conductive particulate matter is sized to ensure that the conductive structure exhibits a feature resolution finer than about 50 micrometers.

Depending on their application, the inventive methods may be practiced with particulate matter that includes solid particles and/or fluid droplets that are at least partially liquid. The particulate matter may be sized to ensure that the conductive structure exhibits a fine feature resolution of about 1 to 50 micrometers, e.g., about 10 micrometers to about 50 micrometers.

The particulate matter may be bonded to each other through different techniques. For example, individual particles of the particulate matter may be chemically, thermally, and or mechanically bonded to each other. Similarly, the particulate matter may be bonded to the substrate using such techniques.

Molds associated with the invention may be at least partially polymeric. The cavity may have a height of about 25 to about 500 micrometers, optionally of about 50 to about 250 micrometers. The invention may also involve filling the mold with a metallic material, e.g., by electroplating conductive material onto the substrate surface in the mold.

Once filled, the mold may be chemically, thermally, and or mechanically removed from the particulate matter and/or substrate. Optionally, solder may be electrically connected to any conductive structure formed using the inventive methods.

DETAILED DESCRIPTION OF THE INVENTION

Definitions and Overview

Figure 1A:
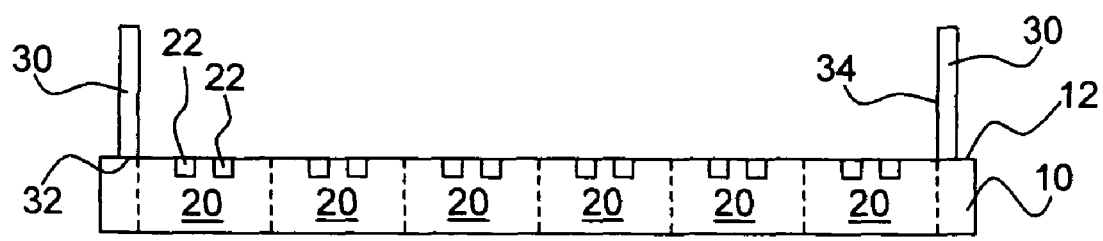
FIGS. 1A-1H, collectively referred to as FIG. 1, depict in cross sectional view an exemplary method of the invention involving a mold.

Before describing the present invention in detail, it is to be understood that this invention, unless otherwise noted, is not limited to specific substrates, particulate matter, or dispensers, all of which may vary. It is also to be understood that the terminology used herein is for the purpose of describing particular embodiments only, and is not intended to be limiting.

It must be noted that, as used in this specification and the appended claims, the singular forms "a", "an" and "the" include both singular and plural referents unless the context clearly dictates otherwise. Thus, for example, reference to "a substrate" includes a plurality of substrates as well as a single substrate, reference to "a mold" includes a pattern of molds as well as a single mold, reference to "a particle" includes one or more particles, and the like.

In describing and claiming the present invention, the following terminology will be used in accordance with the following definitions.

The term "die" is used in its ordinary sense from a semiconductor, microelectronic, and/or integrated circuits industry perspective and refers to a small block of semiconductor material, on which a circuit is fabricated. Typically, integrated circuits are produced in quantity as an array on a single semiconductor wafer. The array is separated into pieces, each containing a copy of the circuit. Each of these pieces is a die.

The term "feature resolution" as in "feature resolution of a structure of a desired three-dimensional shape" is used to refer to the fineness of detail required to distinguish whether the desired shape is present. For example, when the desired shape of a structure comports to a regular polyhedron such as a cube, the feature resolution of a cube must be sufficiently fine to account for the fact that a cube must have six generally congruent surfaces, eight corners, and twelve edges. Thus, the feature resolution of a cube having a volume of one cubic meter must be much finer than one meter, e.g., one centimeter. Otherwise, the cube may not be distinguishable from a sphere of a one-meter diameter.

"Optional" or "optionally" means that the subsequently described circumstance may or may not occur, so that the description includes instances where the circumstance occurs and instances where it does not. For example, the phrase "optional ring" as in "an optional ring is placed on the upper surface of the wafer" means that a ring may or may not be present on the upper surface of the wafer, and, thus, the description includes circumstances wherein a ring is present on the upper wafer surface and circumstances wherein a ring is absent from the upper wafer surface.

The term "particulate matter" is used to refer liquid and/or solid materials that exist or existed in the form of minute separate particle, e.g., as a powder or as aggregated granules. Typically, particulate matter used to form any particular structure has an average and/or maximum particle size appropriate to the structure's "feature resolution".

The term "semiconductor" is used to refer to any of various solid substances having electrical conductivity greater than insulators but less than good conductors, and that may be used as a base material for dies that hold microelectronic circuits and/or electronic devices. Semiconductors include elements such as silicon and germanium and compounds such as silicon carbide, aluminum phosphide, gallium arsenide, and indium antimonide. Unless otherwise noted, the term "semiconductor" includes any one or a combination of elemental and compound semiconductors, as well as strained semiconductors, e.g., semiconductors under tension or compression. Exemplary indirect bandgap semiconductors suitable for use with the invention include Si, Ge, and SiC. Direct bandgap semiconductors suitable for use with the invention include, for example, GaAs, GaN, and InP.

The terms "substantial" and "substantially" are used in their ordinary sense and refer to matters that are considerable in importance, value, degree, amount, extent or the like. For example, the phrase "substantially planar surface" refers to a surface that is characterized by an overall length and width and has a generally flat profile such that no portion of the surface has a height that deviates from the overall length and width by more than a few percent. Other uses of the term "substantially" involve an analogous definition.

The term "substrate" as used herein refers to any item having a surface, which is intended for processing. The substrate may be constructed in any of a number of forms, for example, such as a semiconductor wafer containing an array of dies, etc. However, the term is not limited to items made from semiconductor materials. For example, the term may be used to describe carriers used for packaging semiconductor dies.

The term "subtractive" as in "subtractive step" is used herein in its ordinary sense to describe the removal of material from bulk, e.g., from bonded particulate matter, to form a structure of a desired shape.

The invention is generally directed to methods for forming a conductive structure, freestanding or otherwise, of a desired three-dimensional shape on a substantially planar surface of a substrate, e.g., a semiconductor wafer, a microelectronic die, a packaged silicon chip, etc. Typically, the particulate matter is deposited in a layer-by-layer manner and adhered to selected regions on the substrate surface. The particulate matter may be deposited to produce a mold for forming the structure and/or to produce the structure itself. The inventive methods may involve using a printer or three-dimensional printer with electronic data without need for a lithographic mask or reticle. In addition or in the alternative, the particulate matter may be of a size and or composition to facilitate the production of a conductive structure that exhibits a feature resolution of at least about 50 micrometers. The conductive structure is typically electrically connected with a semiconductor microelectronic device.

For example, the invention may involve the use of three-dimensional printing technology previously associated with fast prototyping of structures items of relatively large feature resolutions e.g., of about 0.1 mm. The printing technology may be used to deposit particulate matter on semiconductor wafers to produce a mold. In turn, the mold may be used in electroplating or other type of deposition processes during back-end semiconductor packaging applications. Unlike photolithographic techniques, printing technologies that may be used with the invention may not require a subtractive step. In addition, the invention may involve the deposition of particulate matter that results in structures of a feature resolution finer than about 50 micrometers. Such fine resolution may involve deposition droplets or particle finer than about 50 micrometers.

Any of a number of different three-dimensional printing techniques may be employed to practice the invention. For example, laser sintering techniques may be used to form three-dimensional structures of desired shapes. Such techniques typically involve spreading loosely compacted particulate matter, e.g., in the form of plastic powder, evenly onto a flat surface with a roller mechanism. The thin particulate layer is then raster-scanned with a high-power laser beam. The particulate matter that is struck by the laser beam is fused together. The areas not hit by the laser beam remain loose and fluent. Successive layers are deposited and raster-scanned, one on top of another, until an entire structure is complete. Each layer is sintered to a sufficient degree to ensure its bonding to its preceding layer.

Another suitable three-dimensional printing technique involves using an inkjet stream of fluid to create three-dimensional objects under computer control in a manner similar to the way an ink-jet printer produces two-dimensional graphic printing. In some instances, a metal, metal alloy or metal composite part may be produced by ink-jet printing liquid metals to form successive cross sections, one layer after another, to a target using a cold welding (i.e., rapid solidification) technique, which causes bonding between the particles and the successive layers. Other fluids suitable for using inkjet applications include, e.g., fluids containing a conductive material such as metallic nanoparticles optionally functionalized or encapsulated by organic moieties, or a fluid containing a conductive precursor such as an organometallic compounds.

Still another suitable three-dimensional printing technique is described in U.S. Pat. No. 5,204,055 to Sachs et al. The technique involves first depositing a layer of a fluent porous material in a confined region and then depositing a binder material to selected regions of the layer material to produce a layer of bonded material at the selected regions. The steps are repeated a selected number of times according to a computer model to produce successive layers of selected regions of bonded material to form a desired component. The unbonded material is then removed. In some cases the component may be strengthened, for example, via heating.

U.S. Pat. Nos. 5,807,437 and 6,146,567, each to Sachs et al., describes an improvement to the above-described technique. In general, a binder printhead is provided having an array of nozzles, which controllably supply jets of binder material droplets to the layers of porous material. The printhead is scanned in a raster scan fashion over each layer of porous material along a first scan axis in one direction to provide first fast scanning paths of droplets. The printhead is then moved laterally of such one direction and is then moved along the fast-scan axis in the opposite direction to provide second fast scanning paths of droplets which are interlaced with those deposited via the first scanning paths. The supply of the droplets to the porous material can be controlled ensure optimal scanning path overlapping to produce various desired surface and interior characteristics of the components. Optionally, the droplets may be electrically charged.

An Exemplary Mold Method

FIGS. 1A-1H depict an exemplary embodiment of the inventive method that involves a mold and is practiced in a wafer level context. As with all figures referenced herein, in which like parts are referenced by like numerals, FIGS. 1A-1H are not to scale, and certain dimensions may be exaggerated for clarity of presentation. In FIG. 1A, a substrate 10 is provided in the form of a wafer having a substantially planar upper surface 12 and containing integrated circuits that may be separated into microelectronic dies 20. Each die has a number of terminals 22 on its upper surface 12.

As shown, an optional ring 30 is placed on the upper surface 12 of the wafer 10. The ring circumscribes a region that contains the terminals 22 for all dies 20. The lower surface 32 of the ring 30 conforms to the contour of the upper wafer surface 12 while the interior side surface 34 of ring 30 generally extends perpendicularly relative to the upper surface 12 of the wafer. However, no ring or equivalent is required in the practice of the invention.

Figure 1B:
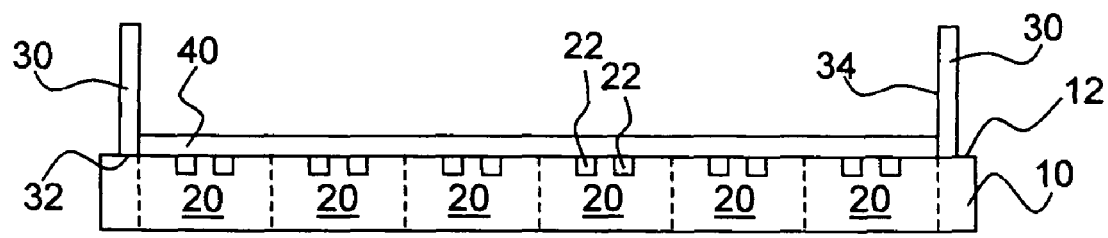
Figure 1C:
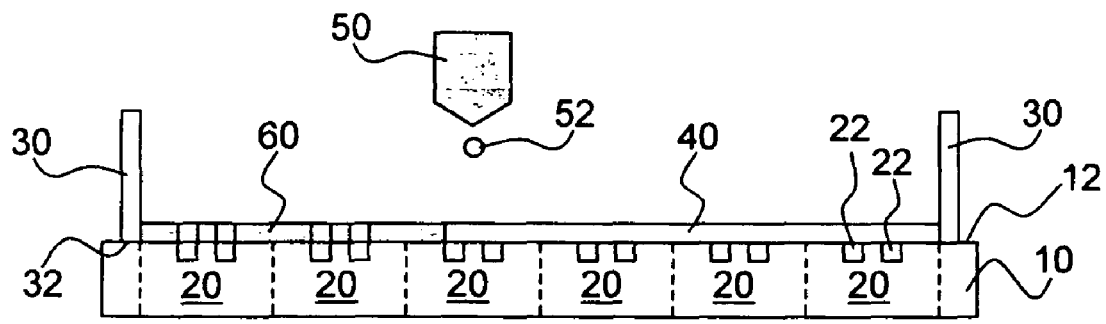
Figure 1D:
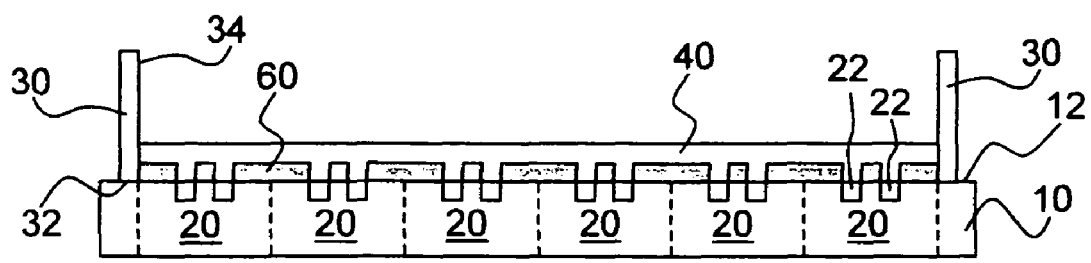
Figure 1E:
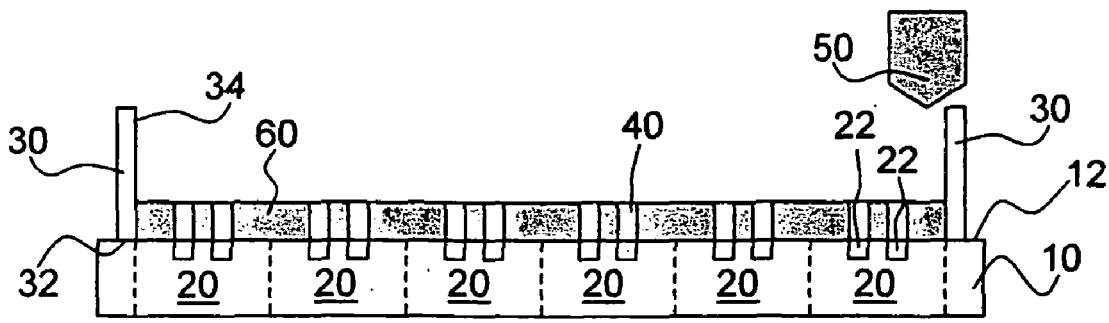

In FIG. 1B, a powder 40 is generally deposited on the upper wafer surface 12 within the region confined by the ring 30 forming a relatively loose powder layer of generally uniform thickness. Powder 40 may be fully metallic, partially metallic or nonmetallic. In FIG. 1C, a particulate matter dispenser 50 in the form of an inkjet print head is scanned over the powder layer to deposit particulate matter in the form of binder droplets 52 selectively at locations within the ring 30 that do not lie above the terminals 22. As a result, the powder at such locations becomes aggregated by droplets 50 and bonded to the wafer surface 12, thereby forming a unitary mold structure 60. As shown in FIGS. 1D and 1E, the powder/binder layer deposition process may be repeated to build up the mold structure.

Figure 1F:
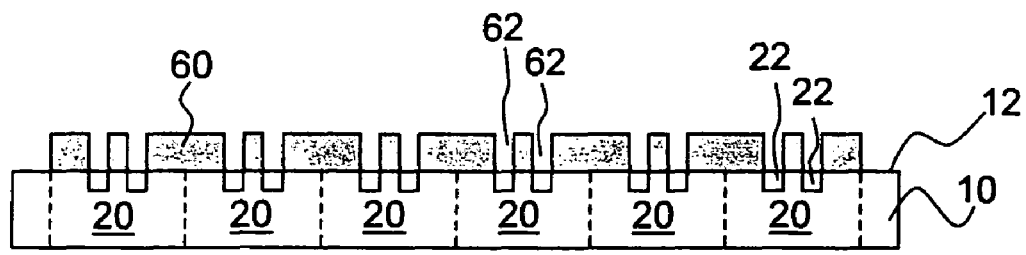

In FIG. 1F, the ring 30 and the remaining loose powder are removed from the wafer surface 12. As a result, a freestanding a mold 60 remains which has been built up layer-by-layer. As shown, the cavities 62 are each defined by an interior surface that extends from a substantially planar base opening and exhibit substantially identical three-dimensional shapes. However, the cavities may be made to exhibit different shapes in other instances.

Figure 1G:
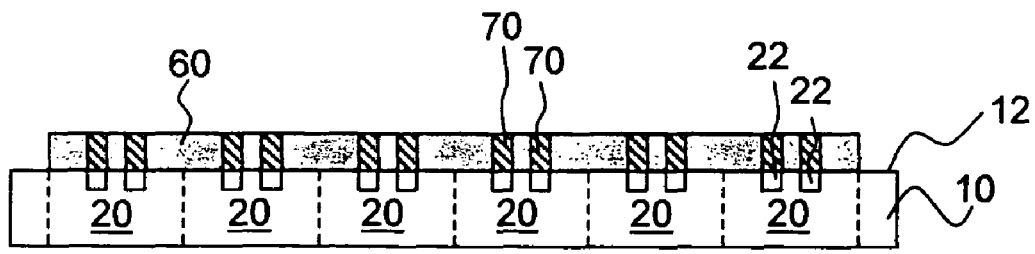
Figure 1H:
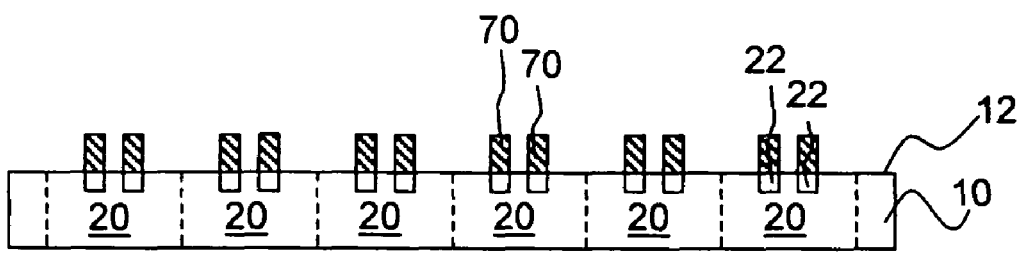

By submerging the wafer surface 12 and the mold 60 in an appropriate plating bath, the cavities of the molds, as shown in FIG. 1G, may be filled with conductive material via electrodeposition, thereby forming conductive structures 70. Then, as shown in FIG. 1H, the mold 60 may be removed without displacing the conductive structure 70 from substrate surface 12, leaving freestanding conductive structures 70 of desired three-dimensional shapes abutting the terminals. Since the cavities of the mold structure can be of any desired shape and do not necessarily have to be identical, conductive structures formed therefrom can also be of any desired shape and do not have be identical.

Various electrodeposition processes may be used. For example, electroplating processes may involve a single bath or a plurality of baths. When a plurality of baths of different compositions are used, layers of different metals may be deposited in series over one another. For example, an Au layer may be deposited on a Ni layer, which in turn may have been deposited on a Cr layer. In addition, the layers may vary in thickness. In any case, exemplary conductive materials that can be electroplated include, but are not limited to, Cr, Ni, Cu, Au, Ag, Ti, alloys thereof, and combinations of any of the foregoing.

The microelectronic dies may be separated from each other at any time, e.g., along the dotted lines shown in FIG. 1. However, it may be preferred to separate the dies from each other after conductive materials are deposited thereon. To separate the microelectronic dies, the wafer may be diced using any of a number of techniques known in the art.

An Exemplary Moldless Method

Figure 2A:
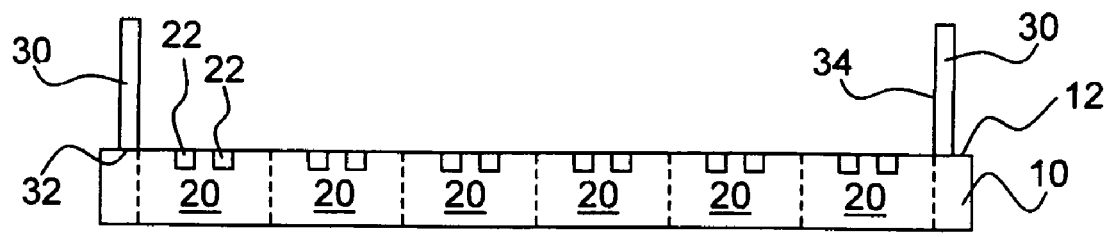
FIGS. 2A-2F, collectively referred to as FIG. 2, depict in cross sectional view an exemplary method for the invention that does not involve a mold.
Figure 2B:
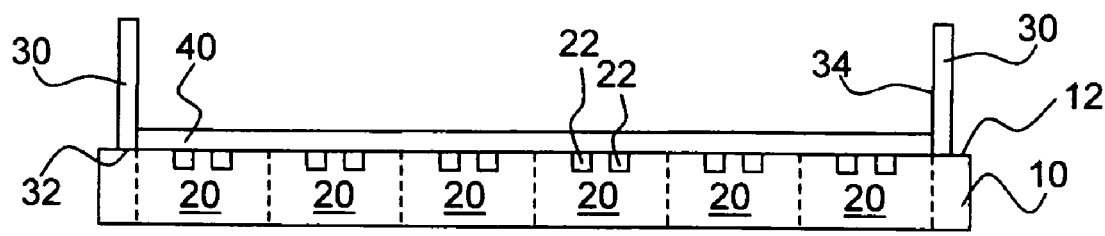
Figure 2C:
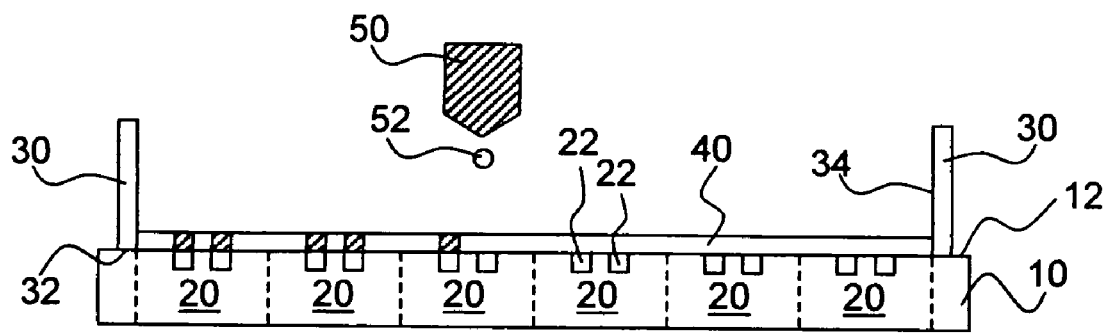
Figure 2D:
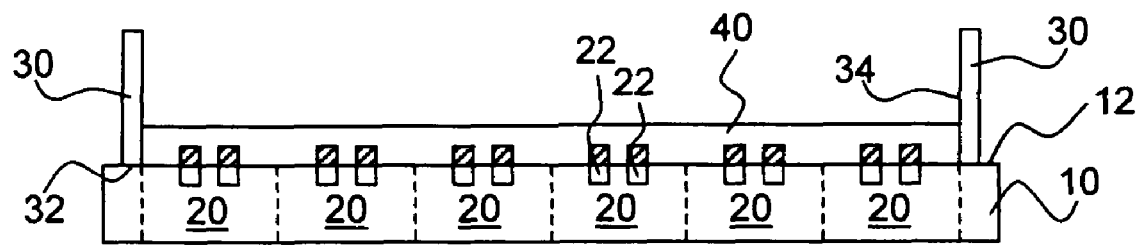
Figure 2E:
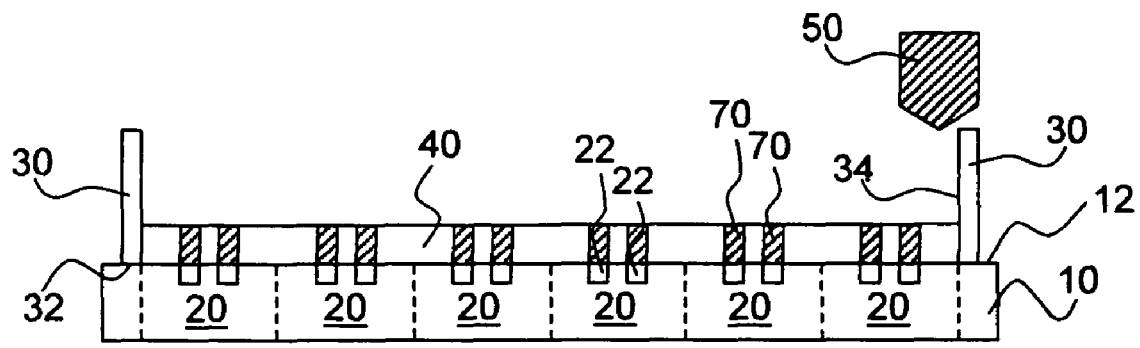

The invention may also be practiced to form conductive structures of desired three-dimensional shapes on a semiconductor substrate without forming an intermediate mold. For example, FIGS. 2A-2F depict an exemplary embodiment of the inventive method that may serve as a moldless counterpart to the embodiment described above. FIG. 2A depicts a setup akin to that shown in FIG. 1A. In FIG. 2B, a metallic powder 40 is generally deposited on the upper wafer surface 12 within the region confined by the optional ring 30 to form a relatively loose powder layer of generally uniform thickness. In FIG. 2C, a particulate matter dispenser 50 in the form of an inkjet print head is scanned over the powder layer to deposit particulate matter in the form of electrically conductive binder droplets 52 selectively at locations within the ring that lie above the terminals 22. As a result, the powder at such locations becomes bonded to the wafer surface 12. As shown in FIGS. 2D and 2E, the electrically conductive powder/binder layer deposition process may be repeated to form electrically conductive structures of desired three-dimensional shapes. Optionally, different powders and/or binders may be used. For example, powders and/or binders of different colors may be used to provide an indication of height and/or depth of three-dimensional shapes.

Figure 2F:
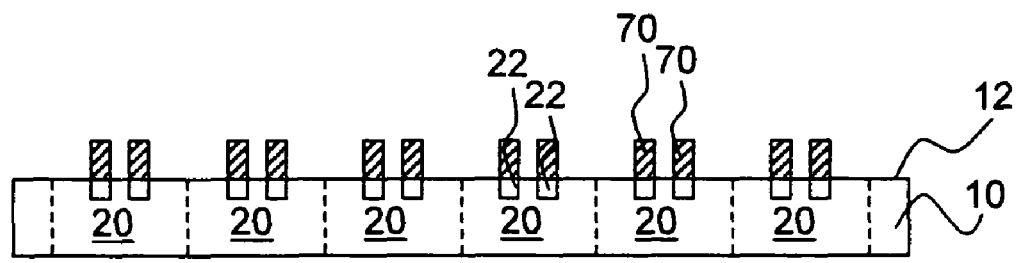

In FIG. 2F, the ring 30 and loose powder is removed from the wafer surface 12. As a result, freestanding conductive structures 70 remain. Optionally, the freestanding conductive structures may be subjected to additional processing to render them more suited for their intended purpose. Such additional processes include, for example, steps to enhance particulate bonding through chemical, thermal, and/or mechanical procedures. In some instances, photoactivated procedures may supplement or supplant other bonding procedures. In any case, the conductive structures formed as a result of the invention may exhibit a feature resolution finer than about 50 micrometers, e.g., about 1 micrometers to about 50 micrometers.

Particulate Matter

Depending on how the invention is practiced, different particulate matter may be employed. In general, the particulate matter must be suitable for its intended use. For example, when the particulate matter is used to produce a mold for forming a freestanding conductive structure on a substrate, the particulate matter should be selected so that the mold formed as a result may be readily removed from the substrate surface. In particular, the mold should be readily removable without displacing a conductive structure from substrate surface or otherwise disturbing the molded structure. Since dissimilar materials tend to be more easily separated from each other than similar materials, one of ordinary skill in the art may select particulate material for mold forming applications so that it differs in composition from the freestanding conductive structure to be formed.

For example, as discussed below, particulate matter may be used to form a mold in which metal may be plated. In such a case, the particulate matter should be comprised of a material that exhibits good structural integrity, adhesion to the surface, and resistance to plating bath solutions. However, the material should also be easily removable from the structure plated in the mold once plating has been completed.

When the particulate matter is to be incorporated into a conductive structure, the particulate matter should not render any structure formed therefrom insulating. For example, the particulate matter may be itself conductive. However, nonconductive particulate matter may be employed in conjunction with conductive materials to form conductive structures as long as there is sufficient conductive material present to preserve the bulk structure's conductivity. In addition, nonconductive particulate matter that may be readily converted into a conductive material may be used. For example, while organometallic droplets may themselves be nonconductive, a droplet may be exposed to conditions that allow metal to precipitate therefrom to take solid form that readily conducts electricity. Examples of conductive materials that may be formed include metals such as Cr, Ni, Ti, Au, and Ag, semiconductors such as Si, Ge and C having a dopant concentration and/or structure that provide them with a sufficiently high degree of conductivity, and conductive cermets.

Thus, depending on the particular practice of the invention, the particulate matter associated with the invention may be of any class or combination of materials. In some instances, dielectric materials such as ceramic material may be used. Exemplary ceramic materials include single or mixed metal oxides such as aluminum, zirconium or silicon oxides, nitrides, and carbides.

Polymeric materials may be used as well. For example, polyimides are known for their chemical stability and their ability to withstand harsh chemical environments associated with semiconductor packaging applications. At the same time, certain polyimides are chemically etchable in hot potassium hydroxide for removal. Other polymeric materials include, but are not limited to, polyesters such as polyethylene terephthalate and polyethylene naphthalate, polyalkanes such as polyethylene, polypropylene and polybutylene, halogenated polymers such as partially and fully fluorinated polyalkanes and partially and fully chlorinated polyalkanes, polycarbonate, epoxies, and polysiloxanes. As discussed above, the particulate matter may be used to form molds and other solid structures from a combination of polymeric and ceramic materials.

However, metals may be used as well. For example, the conductive structures of the invention may be formed from one or more metals, e.g., copper, gold, silver, nickel, tin, titanium, tantalum, tungsten, chromium, iron, aluminum, zinc, combinations thereof, or alloys of any of the foregoing such as brass, bronze, and steel. In addition or in the alternative, a nonmetallic conductive material may be used. Suitable nonmetallic conductive materials include, for example, carbon, e.g., graphite or acetylene black, conductive ceramics such as indium tin oxide and titanium nitride, and conductive polymers such as polypyrrole and polyaniline.

Furthermore, cermets, i.e., composite materials of ceramic (cer) and metallic (met) materials may be used. In some instances, cermets are designed to have the optimal properties of both a ceramic, such as high temperature resistance and hardness, and those of a metal, such as the ability to undergo plastic deformation and electrical conductivity. For example, cermets are used in the manufacture of resistors, capacitors, and other electronic components which may experience high temperatures. Exemplary cermets include carbides, nitrides, and mixed carbides and nitrides, such as TiCN, TiC, TiN, and tungsten carbide.

In some instances, the particulate matter of the invention may involve nanoparticles, conductive or otherwise. For example, U.S. Patent Application Publication No. 20070175296 to Subramanian et al. describes a metallic nanoparticle composition compatible for use in printing low resistance conductors on a plastic base that comprises organic molecule encapsulated metallic nanoparticles. The nanoparticles have a particle average maximum dimension in the range of about 1 nm to about 50 nm. The organic molecule has a molecular weight that permits its evaporation after deposition of the composition onto a substrate at a temperature below the melting point of plastic at atmospheric pressure. The organic molecule further includes an end, e.g., a thiol end, that is absorbable onto the surface of the nanoparticle, and another end that remains free to forming the encapsulant.

As discussed above, particulate matter to be incorporated into a conductive structure should not render the structure insulating. However, when nanoparticle compositions of conductive particles encapsulated by nonconductive moieties are used to form a conductive structure, certain nonconductive moieties may not be easily removable from the particles' surface. Thus, care should be taken to lower the likelihood of nonconductive residue formation when such nanoparticle compositions are used. For example, it may be preferable to keep the number of organic molecules adsorbed per nanoparticles low to lower the likelihood of forming organic residue that is electrically passivating. In addition, moieties containing certain elements may be avoided in the selection of encapsulating moieties in case of decomposition. For example, titanium particles intended for forming conductive structures may be preferentially encapsulated with an amine-containing encapsulating moiety over a thiol-containing moiety since titanium nitride tends to be more conductive than titanium sulfide.

Electrically Conductive Structures

As discussed above, the invention may employ electrically conductive materials in the form of particulate matter. Other forms of conductive materials can be used. For example, when the invention involves producing an electrically conductive structure by filling a mold with a conductive material, the mold may be filled using electroplating or other techniques known in the art.

In an exemplary process for forming copper structures, an initial tiecoat, e.g., (adhesion) layer may be applied using vacuum deposition techniques. The tiecoat may serve to enhance adhesion and/or provide a barrier layer. Exemplary tiecoat metal includes chromium and nickel based alloys such as monel. The tiecoat can be as thick as several hundreds of angstroms, and as thin as a few angstroms. Chromium has advantages in that it provides superior adhesion performance.

Then, a seedcoat having sufficient electrical conductivity to permit electroplating to final thickness may be deposited, e.g., through sputtering or evaporation, on the tie coat. Typically, the seedcoat is comprised of the same metal used to form the bulk of the conductive structure. Thus, when the conductive structure comprises or consists essentially of copper, the seedcoat metals may comprise or consist essentially of copper. Once the seedcoat is deposited, additional metal, e.g., copper may be electrodeposited thereon.

Other electrically conductive materials maybe used as well. For example, metals suitable for use in the invention include, for example, gold, silver, nickel, tin, chromium, iron, aluminum, zinc, titanium, tantalum, tungsten, combinations thereof, and alloys of any of the foregoing such as brass, bronze, and steel. As discussed below, small-grained metals are preferred for greater feature resolution. Solder materials or other materials with a relatively low melting point may be used as well.

In addition or in the alternative, a nonmetallic electrically conductive material may be used to form the conductive regions. Exemplary nonmetallic conductive materials include carbon, e.g., graphite or acetylene black, conductive ceramics such as indium tin oxide and titanium nitride, and conductive polymers such as polypyrrole and polyaniline. Furthermore, a conductive structure may have a surface layer of a composition different from its bulk. For example, the surface of the conductive structure may be comprised of a highly conductive coating such as gold, gold/nickel, gold/osmium or gold/palladium, or plated with a wear resistant, coating such as osmium, chromium or titanium nitride.

In any case, electrically conductive structures should be formed from a material that that allows the structure to exhibit adequate structural integrity, sufficient conductivity, good adhesion to the surface and other qualities that comport to accepted semiconductor quality and reliability metrics. Optimally, the structures should have a conductivity of at least about $10^5$ σ/m to about $10^6$ σ/m.

Feature Resolution

Feature resolution also represents an important aspect of the invention. For example, certain microelectronic packaging processes involve the formation of electrically conductive structures having a height of about 25 to about 500 micrometers, or more specifically, a height of about 50 to about 250 micrometers. Such structures may be approximately as tall as they are wide. Feature resolution for such structures should be sufficiently fine to ensure the structures conform to a desired shape. For example, larger structures should exhibit a feature resolution finer than about 50 micrometers. Smaller structures should exhibit a feature resolution finer than about 10 micrometers.

A number of factors may dictate feature resolution. One important factor is the size of the particulate matter used. In general, particulate matter of a smaller particle size tends to lead to finer feature resolution. Nevertheless, smaller particles have a greater surface area per volume. In turn, surface forces tend to have a greater affect on particulate matter of a smaller particle size than those of a larger size.

Another factor that affects feature resolution is the composition of the particulate matter. For example, some embodiments of the invention may involve the deposition of particulate matter in the form of droplets of a solution from which a solute may be precipitated out of solution when the solvent is removed. In such a case, droplets having a lower concentration of solute tend to produce a structure having a finer feature resolution than droplets of the same volume having a higher concentration.

Still another factor that affects resolution relates to how particulate matter is deposited. For example, while inkjet technology may control droplet deposition by a printhead at intervals of 1/300 inch, or approximately 85 microns, such a 300 dots-per-inch droplet placement may be insufficient for the creation of three-dimensional structures of a fine feature resolution. Structures formed using 300 dots-per-inch placement may exhibit a generally rough surface finish. In addition, the printhead, upon repeated use may experience clogging and may require cleaning and other types of maintenance to ensure that droplet size and trajectory remain within predetermined parameters. Further problems with ordinary inkjet technologies as applied to three-dimensional printing are described in U.S. Pat. No. 5,204,055 to Sachs et al.

Thus, in order to produce structures of a desired feature resolution, a plurality of factors should be addressed to ensure accurate and precise placement of particulate matter of an appropriate size. In addition to the above-discussed factors, it has been discovered that uncontrolled electrostatic charge may pose a problem in the practice of the invention. For example, uncontrolled electrostatic charge may be accumulated by the particulate matter itself, by the substrate onto which particulate matter are deposited, and/or by the dispenser from which the particulate matter may be deposited. Such charge may have a detrimental influence on feature resolution due to errors in the trajectory, positioning and/or even the volume of the dispensed droplets. Thus, a means for reducing uncontrolled charge may be required to ensure that the structure formed using the inventive method exhibits a desired feature resolution.

Means for reducing uncontrolled electrostatic charge may be selected according to the location, amount, and type of static electricity to be eliminated. A number of electrostatic control techniques are known in the art and are suited for use with the present invention. Such techniques typically involve either addition or removal of electrons from the item that has accumulated uncontrolled electrostatic charge. On occasion, though, positive ions may be added or removed from the item. In general, electrostatic charge can be removed through grounding, induction, ionization, or a combination thereof.

Typically, uncontrolled electrostatic charge may be eliminated from an item through grounding, i.e., connecting the item via a conductor to an effectively infinite source of charge. Grounding is particularly suited for instances in which electrostatic charge is located in an ungrounded but highly conductive item. In such a case, the entire item may be neutralized when it is connected to ground at a single point. For items comprised of a single material of high electrical resistivity, e.g., nonconductive polymers and ceramics, however, neutralization of the entire item may require the establishment of more than a single-point contact. In some instances, neutralization of an item may be achieved by providing the item with intermittent or sustained contact with an electrically conductive solid material.

To effect the degree of control over feature resolution associated with the invention, a three-dimensional printer for dispensing particulate matter of an appropriate particle size and having a means for reducing uncontrolled electrostatic charge may be used in conjunction with electronic data relating the conductive structure to be formed (or a mold thereof). Such data may be produced using computer-aided design (CAD) software. For example, the invention may employ a direct-write system that takes the pattern from a CAD-type system and directly prints it onto a silicon wafer. Those of ordinary skill in the art should be able to integrate this type of capability into a three-dimensional printer as such printers routinely take mechanical drawing files and develop prototypes, and semiconductor CAD-type systems have been made to work directly with other direct-write systems.

Advantages of and Variations on the Invention

It should be apparent that the invention provides a number of advantages relating to the practice of microelectronic packaging. In turn, the advantages may translate to cost reductions. For example, current microelectronic packaging techniques for forming conductive structures of height of about 25 to about 500 micrometers is typically associated with a lithography cost that exceeds $10/layer. In comparison, the invention may reduce patterning cost to less than about $3 per layer. The cost savings may arise due to the elimination of the need for a reticle, wafer track, pre-bake station, lithography tool, post-bake station and plasma-ash cleaning station ordinarily associated with a lithographic process. Environmental benefits may also arise from not having to use photoresist and associated chemicals.

It will be apparent to those of ordinary skill in the art that the invention may be embodied in various forms. For example, while specific embodiments of the invention have been described above, additional embodiments involving other techniques may be employed. For example, the invention may be practiced using techniques that may involve injecting two separate chemicals that react and harden when they come in contact with each other or using a single chemical to a substrate that hardens with exposure to air.

Additional variations of the present invention will be apparent to those of ordinary skill in the art. Upon routine experimentation, those skilled in the art may find that the invention may be incorporated into existing equipment or vice versa. For example, pick and place equipment may be used to ensure that conductive structures are electrically connected with semiconductor microelectronic device packages. It is to be understood that, while the invention has been described in conjunction with the preferred specific embodiments thereof, the foregoing description is intended to illustrate and not limit the scope of the invention. Any aspects of the invention discussed herein may be included or excluded as appropriate. For example, any aspect may be used by themselves or in combination. Other aspects, advantages, and modifications within the scope of the invention will be apparent to those skilled in the art to which the invention pertains.

All patents and patent applications mentioned herein are hereby incorporated by reference in their entireties to an extent not inconsistent with the above disclosure.

What is claimed is:

1. A method for forming an electrically conductive structure of a desired three-dimensional shape on a substantially planar surface of a semiconductor substrate, comprising:
   (a) depositing a loose layer of a selected generally uniform thickness of a selected powder on substantially the entire substantially planar surface of the semiconductor substrate;
   (b) scanning a particulate matter dispenser over the powder layer and depositing binder droplets of particulate matter therefrom on the powder layer at selected locations relative to locations of the substrate surface wherein the powder at such locations becomes bonded to the substrate surface at those locations where said electrically conductive structure is not to be formed to produce a mold having at least one cavity therein defined by an interior surface of said bonded powder that extends from a substantially planar base opening abutting the substrate surface and exhibits the desired three-dimensional shape where the powder in said at least one cavity was not bonded to the substrate surface;

(c) removing the loose powder from said at least one cavity to clear the mold;

(d) filling the mold by electroplating an electrically conductive material onto the semiconductor substrate surface within said at least one cavity to form an electrically conductive structure of the desired three-dimensional shape; and (e) removing the mold from the substrate surface without altering the shape of or displacing the conductive structure from the substrate surface.

2. The method of claim 1, wherein the particulate matter comprises fluid droplets that are at least partially liquid.

3. The method of claim 1, wherein the particulate matter comprises solid particles.

4. The method of claim 1, wherein the deposited and bonded powder and particulate matter is sized to ensure that the electrically conductive structure exhibits a feature resolution finer than about 50 micrometers.

5. The method of claim 4, wherein the deposited and bonded powder and particulate matter is sized to ensure that the electrically conductive structure exhibits a feature resolution finer than about 10 micrometer.

6. The method of claim 1, wherein step (b) comprises chemically bonding the particulate matter with the powder.

7. The method of claim 1, wherein step (b) comprises thermally bonding the particulate matter with the powder.

8. The method of claim 1, wherein step (b) comprises mechanically bonding the particulate matter with the powder.

9. The method of claim 1, wherein the mold is at least partially polymeric.

10. The method of claim 1, wherein step (d) comprises filling the mold with a metallic material.

11. The method of claim 1, wherein step (e) comprises chemically removing the mold.

12. The method of claim 1, wherein step (e) comprises thermally removing the mold.

13. The method of claim 1, wherein step (3) comprises mechanically removing the mold.

14. The method of claim 1, further comprising attaching solder to the electrically conductive structure.

15. The method of claim 1, wherein said at least one cavity has a height of about 25 to about 500 micrometers.

16. The method of claim 15, wherein said at least one cavity has a height of about 50 to about 250 micrometers.

17. A method as in claim 1 further comprising the step of:
(e) ensuring that the electrically conductive structure is electrically connected with the semiconductor microelectronic device to form a package for a semiconductor microelectronic device.

18. A method for forming a free-standing, electrically conductive structure of a desired three-dimensional shape on a substantially planar surface of a semiconductor substrate, comprising:

(a) providing a three-dimensional printer with electronic data relating a mold having at least one cavity therein, wherein the printer is constructed to operate without need of a lithographic mask or reticle and the at least one cavity to be formed is defined by an interior surface that extends from a substantially planar base opening and exhibits the desired three-dimensional shape;

(b) using the printer to produce the mold on the substrate surface so the base opening of the at least one cavity abuts the substrate surface;

(c) filling the mold by electroplating an electrically conductive material onto the substrate surface to form an electrically conductive structure of the desired three-dimensional shape; and (d) removing the mold from the substrate surface without removing the electrically conductive structure from the substrate surface or altering the shape of the electrically conductive structure.

19. The method of claim 18, wherein the electronic data is produced using computer-aided design software.

20. A method, as in claim 18 further comprising the step of:
(e) ensuring that the electrically conductive structure is electrically connected with the semiconductor microelectronic device to form a package for a semiconductor microelectronic device.

21. A method for forming an electrically conductive structure of a desired three-dimensional shape on a substantially planar surface of a semiconductor substrate, comprising:

(a) depositing a loose layer of a selected thickness of a selected powder on to locations of the substantially planar surface of the semiconductor substrate other than where said electrically conductive structure is to be formed;

(b) scanning a particulate matter dispenser over locations having the powder layer and depositing binder droplets of particulate matter therefrom om the powder layer bonding the powder to the substrate surface to produce a mold having at least one cavity therein defined by an interior surface of said bonded powder that extends from a substantially planar base opening abutting the substrate surface and exhibits the desired three-dimensional shape, wherein the mold is produced without using a subtractive step that removes unbonded loose powder from the surface of the substrate;

(c) filling the mold by electroplating an electrically conductive material onto the substrate surface to form an electrically conductive structure of the desired three-dimensional shape; and (d) removing the mold from the substrate surface without the shape of or displacing the electrically conductive structure from substrate surface.

22. A method, as in claim 21 further comprising the step of:
(e) ensuring that the electrically conductive structure is electrically connected with the semiconductor microelectronic device to form a package for a semiconductor microelectronic device.

23. A method for forming an electrically conductive structure of a desired three-dimensional shape on a substantially planar surface of a semiconductor substrate, comprising:

(a) depositing a loose layer of a selected thickness of a selected metallic powder on the substantially planar surface of the semiconductor substrate;

(b) scanning a particulate matter dispenser over the powder layer;

(c) while performing step (b), depositing electrically conductive binder droplets from the dispenser on the powder layer relative to selected locations of the surface of the semiconductor substrate wherein the powder at such locations becomes a metal bonded to the semiconductor substrate; and (d) remove the loose powder not bonded to the substrate surface to produce the electrically conductive structure of the desired dimensional shape, wherein the electrically conductive structure exhibits a feature resolution finer than about 50 micrometers.

24. The method of claim 23, wherein the feature resolution is about 1 micrometers to about 50 micrometers.

25. The method of claim 24, wherein the feature resolution is about 10 micrometers to about 50 micrometers.

26. The method of claim 23, wherein the particulate matter comprises metallic particles.

27. The method of claim 26, wherein the metallic particles include a metal selected from copper, gold, silver, nickel, tin, titanium, tantalum, tungsten, chromium, iron, aluminum, zinc, combinations thereof, or alloys of any of the foregoing.

28. The method of claim 23, wherein the particulate matter comprises a cermet.

29. The method of claim 23, performed in the absence of any uncontrolled electrostatic charge.

30. The method of claim 22, wherein the electrically conductive structure exhibits an electrical conductivity of at least about $10^5$ σ/m.

31. The method of claim 28, wherein the electrically conductive structure exhibits an electrical conductivity of at least about $10^6$ σ/m.

32. The method of claim 23 further comprises between steps (c) and (d) the steps of:
   (e) depositing another layer of the selected metallic powder on the previously deposited layer of the selected metallic powder; and
   (f) repeating steps (b) and (c) at least some of the same locations as in the previous performance of step (c).

33. A method for forming a free-standing electrically conductive structure of a desired three-dimensional shape on a substantially planar surface of the semiconductor substrate, the method being performed using a three-dimensional printer with associated electronic data relating to a mould having at least one cavity therein, wherein the printer is constructed to operate without the need of a lithographic mask or reticle, the method comprising:
   (a) using the printer to produce the mold on the substrate surface including the at least one cavity formed therein, the at least one cavity being defined by an interior surface that extends from a substantially planar base opening and exhibits the desired three-dimensional shape and being formed so that the base opening of the at least one cavity abuts the substrate surface;
   (b) filling the mold by electroplating an electrically conductive material onto the substrate surface to form an electrically conductive structure of the desired three-dimensional shape; and
   (c) removing the mold from the substrate surface without removing the electrically conductive structure from the substrate surface or altering the shape of the electrically conductive structure.

34. The method of claim 33, wherein the electronic data is produced using computer-aided design software.

\* \* \* \* \*